United States Patent
Kang et al.

(10) Patent No.: US 10,825,983 B2
(45) Date of Patent: Nov. 3, 2020

(54) MAGNETOELECTRIC ENERGY HARVESTER AND MANUFACTURING METHOD THEREOF

(71) Applicant: Korea Electronics Technology Institute, Seongnam-si, Gyeonggi-do (KR)

(72) Inventors: Hyung Won Kang, Seoul (KR); Seung Ho Han, Uiwang-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 445 days.

(21) Appl. No.: 15/663,484

(22) Filed: Jul. 28, 2017

(65) Prior Publication Data
US 2018/0053890 A1    Feb. 22, 2018

(30) Foreign Application Priority Data

Aug. 22, 2016 (KR) .......... 10-2016-0106020

(51) Int. Cl.
*H01L 41/187* (2006.01)
*H01L 41/08* (2006.01)
(Continued)

(52) U.S. Cl.
CPC .............. *H01L 41/12* (2013.01); *H01L 41/00* (2013.01); *H01L 41/08* (2013.01);
(Continued)

(58) Field of Classification Search
CPC .......... H01L 41/08; H01L 41/12; H01L 41/22
(Continued)

(56) References Cited

U.S. PATENT DOCUMENTS

| 2004/0164649 A1* | 8/2004 | Xu | B81B 3/0024 310/328 |
| 2005/0088310 A1* | 4/2005 | Sakai | E05B 45/06 340/693.2 |

(Continued)

FOREIGN PATENT DOCUMENTS

| KR | 10-2016-0076700 | 7/2016 |
| KR | 2016-0076700 | 7/2016 |

OTHER PUBLICATIONS

Kambale, Rahul C., et al. "Current Status of Magnetoelectric Composite Thin/Thick Films" Hindawi Publishing Corporation, Advances in Condensed Matter Physics, vol. 2012, pp. 1-15.
Office Action received in Korean Patent Application No. 10-2016-0106020, dated Oct. 11, 2018.
Office Action received in Korean Application No. 10-2016-0106020 dated Jul. 7, 2017; 7 pages.
Roundy et al., "A piezoelectric vibration based generator for wireless electronics," Smart Mater. Struct., vol. 13, pp. 1131-1142; 2004.
Office Action received in Korean Patent Application No. 10-2016-0106020, dated Jan. 29, 2018.
(Continued)

*Primary Examiner* — Derek J Rosenau
(74) *Attorney, Agent, or Firm* — Knobbe Martens Olson & Bear LLP

(57) ABSTRACT

A magnetoelectric energy harvester having excellent power generation performance and a manufacturing method thereof are provided. The magnetoelectric energy harvester includes a magnetostrictive material portion including a magnetostrictive material which generates a mechanical deformation when being magnetized. The magnetoelectric energy harvester also includes a piezoelectric material portion which has a bending vibration mode and includes a piezoelectric material which produces power by receiving a mechanical deformation force from the magnetostrictive material portion.

6 Claims, 4 Drawing Sheets

(51) Int. Cl.
*H01L 41/12* (2006.01)
*H02N 2/18* (2006.01)
*H01L 41/20* (2006.01)
*H01L 41/00* (2013.01)
*H01L 41/22* (2013.01)

(52) U.S. Cl.
CPC ...... H01L 41/1871 (2013.01); H01L 41/1873 (2013.01); H01L 41/1875 (2013.01); H01L 41/1878 (2013.01); H01L 41/20 (2013.01); H01L 41/22 (2013.01); H02N 2/188 (2013.01)

(58) Field of Classification Search
USPC ............................................................ 310/339
See application file for complete search history.

(56) References Cited

U.S. PATENT DOCUMENTS

| | | | |
|---|---|---|---|
| 2005/0206275 A1* | 9/2005 | Radziemski | H01L 41/1136 310/339 |
| 2007/0188053 A1* | 8/2007 | Stark | B60C 23/041 310/339 |
| 2007/0296283 A1* | 12/2007 | Tucker | H01L 41/00 310/26 |

OTHER PUBLICATIONS

Xing, Zengping et al., "Investigation of external noise and its rejection in magnetoelectric sensor design," Journal of Applied Physics 106, 024512 (2009).

* cited by examiner

# MAGNETOELECTRIC ENERGY HARVESTER AND MANUFACTURING METHOD THEREOF

CROSS-REFERENCE TO RELATED APPLICATION(S) AND CLAIM OF PRIORITY

The present application claims priority to and the benefit under 35 U.S.C. § 119(a) to Korean patent application filed in the Korean Intellectual Property Office on Aug. 22, 2016, and assigned Serial No. 10-2016-0106020, the entire disclosure of which is hereby incorporated by reference.

TECHNICAL FIELD

The present disclosure relates generally to a magnetoelectric energy harvester and a manufacturing method thereof, and more particularly, to a magnetoelectric energy harvester having enhanced power generation performance, and a manufacturing method thereof.

BACKGROUND

Energy harvesting refers to technology that collects ambient energy which is not used and is wasted and converts the collected energy to electric energy. As one of the representative clean energy systems which can solve environmental issues, normally known as greenhouse effects, and can cope with issues in the age of high oil prices, the energy harvesting is in the spotlight in recent years according to the current of the times of low-carbon green growth.

Such energy harvesting technology may be implemented by various principles including a piezoelectric effect, a photovoltaic effect, or a thermoelectric effect. From among these, researches on technology using materials having piezoelectric characteristics are most actively ongoing. Piezoelectric energy harvesting is a method that stores electric energy using ambient vibrations, and has many advantages that there is no limit to applying technology according to ambient climate or local geography and sub-miniature devices can be implemented.

An element which uses such piezoelectric effect is known as a magnetoelectric element. The magnetoelectric element refers to an element which is formed of a magnetostrictive material which may be deformed by magnetic energy applied from the outside, and a piezoelectric material which generates power according to deformation of an exterior thereof. A magnetoelectric energy harvester is an element which harvests energy using such a magnetoelectric element. When magnetic energy is applied to the magnetoelectric element of the magnetoelectric energy harvester, in which a magnetostrictive material layer and a piezoelectric material are attached to each other, magnetostrictive deformation may be generated on the magnetostrictive material layer, and deformation may be generated on the piezoelectric material layer since the piezoelectric material layer and the deformed magnetostrictive material layer are attached to each other. The deformation of the piezoelectric material layer may induce generation of a voltage and thus self-power generation is achieved.

In order to enhance power generation performance of the magnetoelectric energy harvester, which is eco-friendly and has various advantages in view of its capability of generating power using wasted energy, there has been many attempts to develop various materials or to make various shape deformations, but magnetoelectric energy harvesters which can implement power generation performance of a desired level have not yet been developed.

SUMMARY

To address the above-discussed deficiencies of the prior art, it is a primary aspect of the present disclosure to provide a magnetoelectric energy harvester having excellent power generation performance and a manufacturing method thereof.

According to one aspect of the present disclosure, a magnetoelectric energy harvester includes: a magnetostrictive material portion including a magnetostrictive material which generates a mechanical deformation when being magnetized; and a piezoelectric material portion which has a bending vibration mode and includes a piezoelectric material which produces power by receiving a mechanical deformation force from the magnetostrictive material portion.

The magnetostrictive material may be one of ferromagnetic metal, a ferritic ceramic, a magnetostriction alloy, and a magnetic shape memory alloy.

The piezoelectric material may be one of $PbZrO_3$, $PbTiO_3$, $KNbO_3$, $NaNbO_3$, $BiTiO_3$, $NaTiO_3$, and $BaTiO_3$.

The piezoelectric material portion may include a first piezoelectric material layer which receives an external physical force and performs a first vibration, and a second piezoelectric material layer which performs a second vibration different from the first vibration. The first vibration may be a stretching length direction vibration and the second vibration may be a contraction length direction vibration.

The external physical force may be a mechanical deformation force generated from the magnetostrictive material portion.

According to another aspect of the present disclosure, a method for manufacturing a magnetoelectric energy harvester includes: forming a magnetostrictive material layer by coating with a magnetostrictive material generating a mechanical deformation when being magnetized; and forming a piezoelectric material layer having a bending vibration mode, the piezoelectric material layer being formed by coating with a piezoelectric material which produces power by receiving a mechanical deformation force from the magnetostrictive material layer.

Forming the piezoelectric material layer may include forming a first piezoelectric material layer which performs a first vibration; and forming a second piezoelectric material layer which performs a second vibration different from the first vibration.

According to still another aspect of the present disclosure, a magnetoelectric energy harvester includes: a magnetostrictive material portion including a magnetostrictive material generating a mechanical deformation when being magnetized; and a piezoelectric material portion having a second resonance frequency which is smaller than a first resonance frequency which is a frequency of a length direction vibration.

The piezoelectric material portion having the second resonance frequency may be referred to as a first piezoelectric material portion, and the magnetoelectric energy harvester may further include a second piezoelectric material portion having a third resonance frequency which is smaller than the second resonance frequency.

According to yet another aspect of the present disclosure, a transmission and distribution line monitoring device includes: a sensor unit disposed outside a transmission and distribution line; and a magnetoelectric energy harvester unit which includes: a magnetostrictive material layer including a magnetostrictive material which generates a mechanical deformation when being magnetized by a change in a magnetic field generated from the transmission and distribution line; and a piezoelectric material layer which has a bending vibration mode and includes a piezoelectric material producing power by receiving a mechanical deformation force from the magnetostrictive material layer, and which supplies power to the sensor unit.

The sensor unit may include at least one of a temperature sensor and a pressure sensor.

According to the present disclosure, the magnetoelectric energy harvester includes the piezoelectric material portion which produces power using bending vibrations from the magnetostrictive material layer, such that power can be produced with higher efficiency than a related-art magnetoelectric energy harvester.

In addition, when such a magnetoelectric energy harvester is applied to a monitoring device of a transmission and distribution line in which a magnetic field is generated, power can be autonomously supplied using the magnetic field of the transmission and distribution line without power supply, such that a breakdown is less caused than in a motor-driven power generator such as a motor, and costs required to replace a battery or invest manpower resources for repair can be saved.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
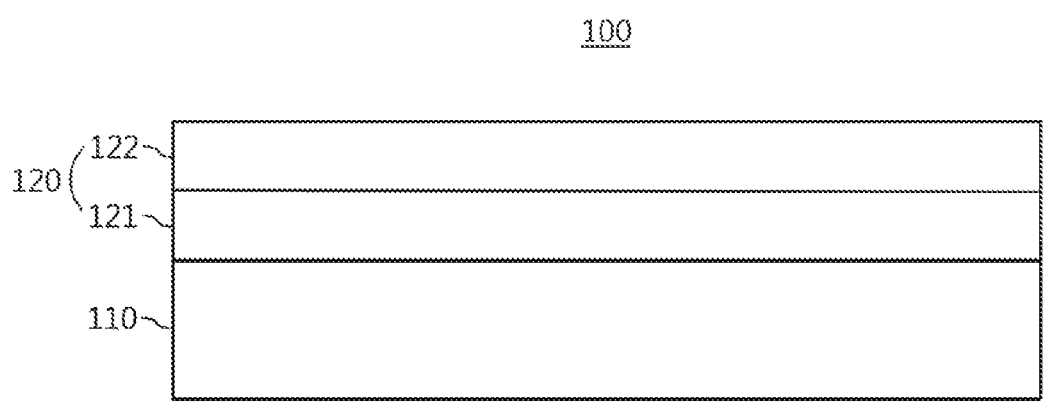
FIG. 1 is a cross section view of a magnetoelectric energy harvester according to one embodiment of the present disclosure.

Exemplary embodiments will now be described more fully with reference to the accompanying drawings to clarify aspects, features and advantages of the inventive concept. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art. In the drawings, there may be an element illustrated as having a specific pattern or having a predetermined thickness, but this is just for convenience of explanation and discrimination. Therefore, even when an element is referred to as having a specific pattern and a predetermined thickness, the present disclosure is not limited to the features of the illustrated element.

Figure 2:
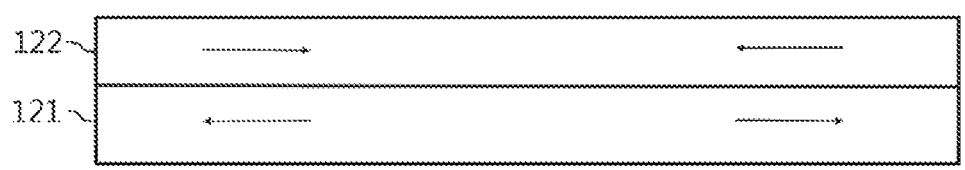
FIG. 2 is a view showing a vibration direction of a piezoelectric material portion in the magnetoelectric energy harvester.

FIG. 1 is a cross section view of a magnetoelectric energy harvester according to one embodiment of the present invention, and FIG. 2 is a view showing a vibration direction of a piezoelectric material portion in the magnetoelectric energy harvester. The magnetoelectric energy harvester 100 according to the present disclosure includes: a magnetostrictive material portion 110 including a magnetostrictive material which generates mechanical deformation when it is magnetized; and a piezoelectric material portion 120 which has a bending vibration mode and includes a piezoelectric material generating power by receiving a mechanical deformation force from the magnetostrictive material portion 110.

The magnetoelectric energy harvester 100 according to the present disclosure is an element which harvests energy using a magnetoelectric effect. The magnetoelectric effect refers to a characteristic that magnetization is caused by applying an electric field or polarization is caused by a magnetic field.

Materials showing such a magnetoelectric effect may include a single phase material such as $Cr_2O_3$, a composite material in which a material having a piezoelectricity and a material having a magnetostrictivity are mixed or a material having magnetostrictivity and a material having a piezoelectricity are stacked one on the other as in the present disclosure. When the stacked structure of the magnetostrictive material and the piezoelectric material is used, there are advantages in view of various aspects like strong elastic coupling between layers, a simple manufacturing process, a high electric resistance, an easy poling process, or a magnetoelectric voltage coefficient ($\alpha ME$).

In the present disclosure, the magnetoelectric energy harvester 100 includes the magnetostrictive material portion 110 and the piezoelectric material portion 120. The magnetostrictive material portion 110 includes a magnetostrictive material in which a magnetostriction phenomenon occurs. The magnetostriction phenomenon refers to a phenomenon that elastic deformation is generated in a ferromagnetic material when the ferromagnetic material is magnetized. That is, the magnetostrictive material generates mechanical deformation when it is magnetized.

The magnetostrictive material may be one of ferromagnetic metal, ferritic ceramics, a magnetostriction alloy, and a magnetic shape-memory alloy. The ferromagnetic metal used in the present disclosure may be metal such as nickel, cobalt or iron. The ferritic ceramics used in the present disclosure may be, for example, spinel type or magnetoplumbite type ferrite expressed by general formula $MFe_2O_4$ or $MFe_{12}O_{19}$ (M is a divalent metal ion of one or more species), ferrite expressed by $M'_3Fe_5O_{12}$ (M' is a trivalent metal ion), or lithium ferrite expressed by $Li_{0.5}Fe_{2.5}O_4$.

The magnetostriction alloy used in the present disclosure may include an alloy of terbium-dysprosium-iron (Terfenol-D), an alloy of gallium-iron (Gafenol), an alloy of samarium-dysprosium-iron (Samfenol-D), an alloy of boron-silicon-iron (Metglas 2605SA1), an alloy of boron-silicon-carbon-iron (Metglas 2605SC), or the like. In addition, the magnetic shape memory alloy may be, for example, a $Ni_2MnGa$ alloy, a NiMnIn alloy, a NiCoMnIn alloy, a FePd alloy, a FeNiGa alloy, CoNiGa alloy, or the like.

The piezoelectric material portion 120 includes a piezoelectric material which has a piezoelectric phenomenon that a voltage is generated when mechanical deformation is applied and mechanical deformation is generated when a voltage is applied. The piezoelectric material may use, but not limited to, one of $PbZrO_3$, $PbTiO_3$, $KNbO_3$, $NaNbO_3$, $BiTiO_3$, $NaTiO_3$, and $BaTiO_3$.

In the magnetoelectric energy harvester 100 according to the present disclosure, the piezoelectric material portion 120 has a bending vibration mode. The piezoelectric material may adjust a vibration type occurring therein by adjusting a polarization direction, a shape of an electrode, or the like. The piezoelectric material portion 120 in the present disclosure is a piezoelectric element in which bending vibrations occur. That is, the piezoelectric material portion 120 of the present disclosure is a piezoelectric element in which bending vibrations entirely occur unlike a piezoelectric element which stretches and contracts only in the length direction.

The piezoelectric material portion 120 includes a first piezoelectric material layer 121 which performs a first vibration associated with a first resonance frequency and a second piezoelectric material layer 122 which performs a second vibration associated with a second resonance frequency different from the first vibration. The first vibration and the second vibration are mixed such that bending vibrations occurs in the piezoelectric material portion 120. The piezoelectric material portion 120 may generate bending vibrations therein as described above and may also generate bending vibrations when receiving a mechanical deformation force from the magnetostrictive material portion 110.

For example, the first vibration may be a stretching length direction vibration, and the second vibration may be a contraction length direction vibration. That is, the first piezoelectric material layer 121 and the second piezoelectric material layer 122 may receive the mechanical deformation force from the magnetostrictive material portion 110 and may all vibrate in the length direction. However, when the first piezoelectric material layer 121 vibrates in the stretching direction and the second piezoelectric material layer 122 vibrates in the contraction direction different from the stretching direction of the first vibration as shown in FIG. 2, the piezoelectric material portion 120 may entirely generate bending vibrations.

Figure 3:
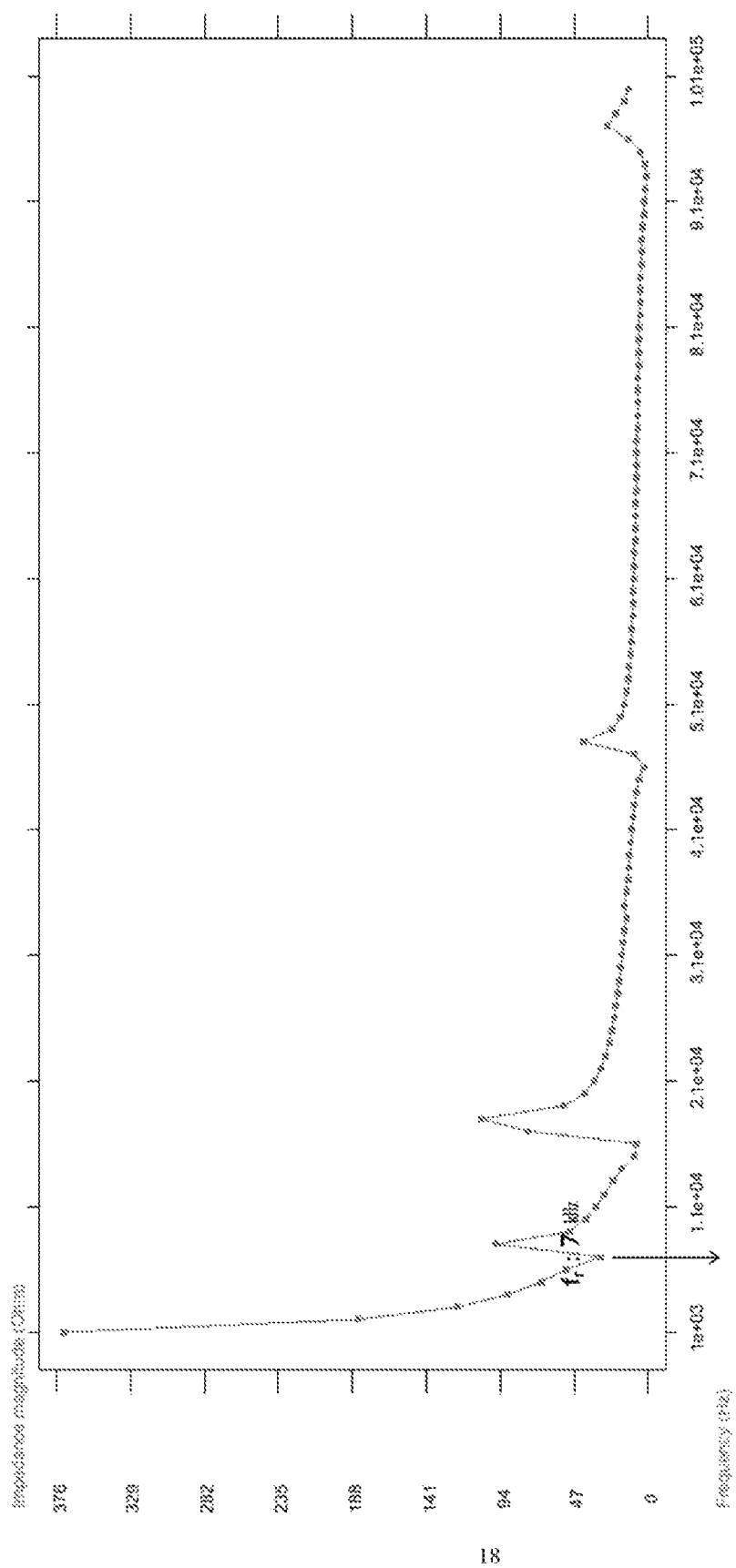
FIG. 3 is a graph showing a resonance frequency of the piezoelectric material portion in the magnetoelectric energy harvester according to one embodiment of the present disclosure.
Figure 4:
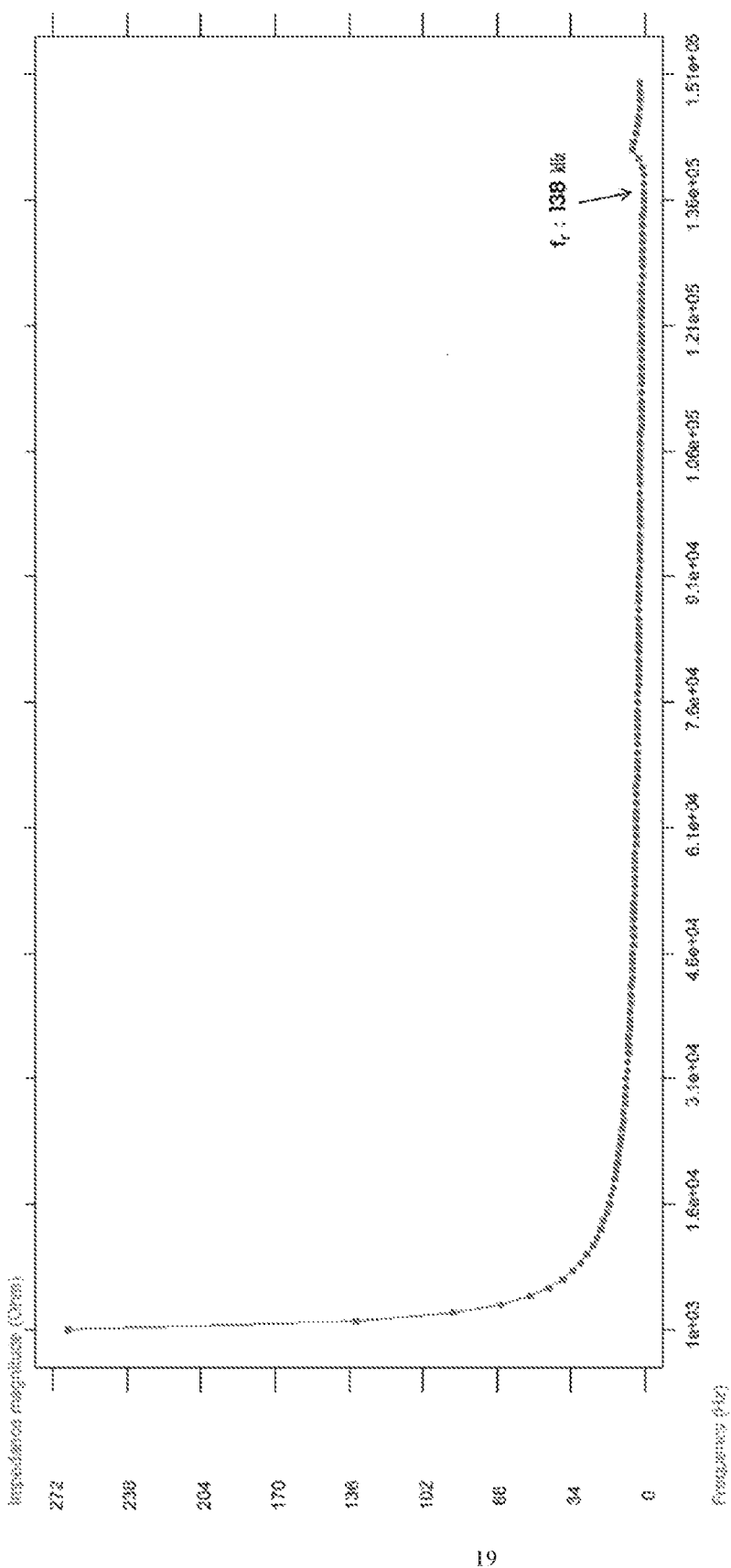
FIG. 4 is a graph showing a resonance frequency of a piezoelectric material portion having a length direction vibration type structure.

When the piezoelectric material portion 120 has the bending vibration structure, the amount of power generated in the magnetoelectric energy harvester 100 is higher than in other vibration structures. This is because bending vibrations in a piezoelectric material reduces a resonance frequency and the low resonance frequency makes it easy to collect ambient energy. In other words, the frequency of ambient energy and the resonance frequency of a piezoelectric material should be equal to each other so as to be able collect energy. However, when the resonance frequency of the piezoelectric material is too high, it is difficult to match the resonance frequency of the piezoelectric material with the frequency of ambient energy, and thus power generation performance may be degraded. FIG. 3 is a graph showing a resonance frequency of the piezoelectric material portion of the magnetoelectric energy harvester according to one embodiment of the present disclosure, and FIG. 4 is a graph showing a resonance frequency of a piezoelectric element having a length direction vibration structure.

FIG. 3 is a graph showing a resonance frequency of the piezoelectric material portion of the bending vibration structure applied to the magnetoelectric energy harvester 100 according to the present invention. It can be seen that a resonance frequency of about 7 kHz appears. To the contrary, FIG. 4 illustrates a resonance frequency of a piezoelectric element having a length direction vibration structure, and it can be seen that a resonance frequency of 138 kHz appears, which is higher than in the case of FIG. 3. Accordingly, when the piezoelectric element having a structure vibrating in the length direction is applied to the magnetoelectric energy harvester, the resonance frequency increases and thus the power generation performance of the magnetoelectric energy harvester is degraded. In this case, the "piezoelectric element having the structure vibrating in the length direction" refers to a piezoelectric element which has a vibration structure of stretching or contracting in one direction.

In the case of a magnetoelectric energy harvester to which a piezoelectric element having a structure vibrating in the length direction is applied, a resonance frequency of tens to hundreds of kHz appears. However, in the case of the magnetoelectric energy harvester to which the piezoelectric element having the bending vibration structure is applied as in the present disclosure, the resonance frequency has a range of a few to tens of kHz. Accordingly, the magnetoelectric energy harvester according to the present invention has a low resonance frequency and thus is efficient in collecting ambient energy, and an energy harvester having high power generation performance can be achieved.

According to another aspect of the present disclosure, there is provided a magnetoelectric energy harvester including: a magnetostrictive material portion including a magnetostrictive material which generates mechanical deformation when it is magnetized; and a piezoelectric material portion having a second resonance frequency which is smaller than a first resonance frequency generated when vibrations are produced in the length direction. The first resonance frequency refers to a resonance frequency of a piezoelectric element having a structure of vibrating in the length direction. Comparing the resonance frequency of a piezoelectric element having a structure of vibrating in the length direction and the resonance frequency of a piezoelectric element vibrating in a bending type, the resonance frequency (that is, the second resonance frequency) of the piezoelectric element vibrating in the bending type is smaller than the resonance frequency (that is, the first resonance frequency) of the piezoelectric element having the structure of vibrating in the length direction even when the piezoelectric elements have the same size and use the same piezoelectric material and the same electrode material.

The magnetoelectric energy harvester in the present embodiment is implemented such that the second resonance frequency of the piezoelectric material portion is smaller than the first resonance frequency of the piezoelectric material vibrating in the length direction. Accordingly, the piezoelectric material portion having the second resonance frequency, which is smaller than the resonance frequency generated when vibrations are produced in the length direction, has the lower resonance frequency and thus power generation performance is enhanced. Therefore, a large amount of power is produced.

In addition, when the piezoelectric material portion having the second resonance frequency is referred to as a first piezoelectric material portion, the magnetoelectric energy harvester according to the present disclosure may further include a second piezoelectric material portion having a third resonance frequency which is smaller than the second resonance frequency. Accordingly, the magnetoelectric energy harvester includes the piezoelectric material portions having low resonance frequencies, and thus can produce a large amount of power.

The magnetoelectric energy harvester according to the present disclosure may be manufactured by performing the steps of: forming a magnetostrictive material layer by coating with a magnetostrictive material which generates mechanical deformation when it is magnetized; and forming a piezoelectric material layer as a piezoelectric material portion having a bending vibration mode by coating with a piezoelectric material which produces power by receiving a mechanical deformation force from a magnetostrictive material portion. The piezoelectric material layer may be formed by performing the steps of: forming a first piezoelectric material layer which performs a first vibration; and forming a second piezoelectric material layer which performs a second vibration different from the first vibration on the first piezoelectric material layer. The piezoelectric material layer may be formed as a single layer including a piezoelectric material and an electrode, or may be formed by stacking a piezoelectric material and an electrode alternately.

The magnetoelectric energy harvester may be implemented by forming a magnetostrictive material portion and sintering a stacking body having a piezoelectric material portion formed therein, or by forming a magnetostrictive material portion and a piezoelectric material portion as layers and then bonding them by means of an adhesive layer.

Figure 5:
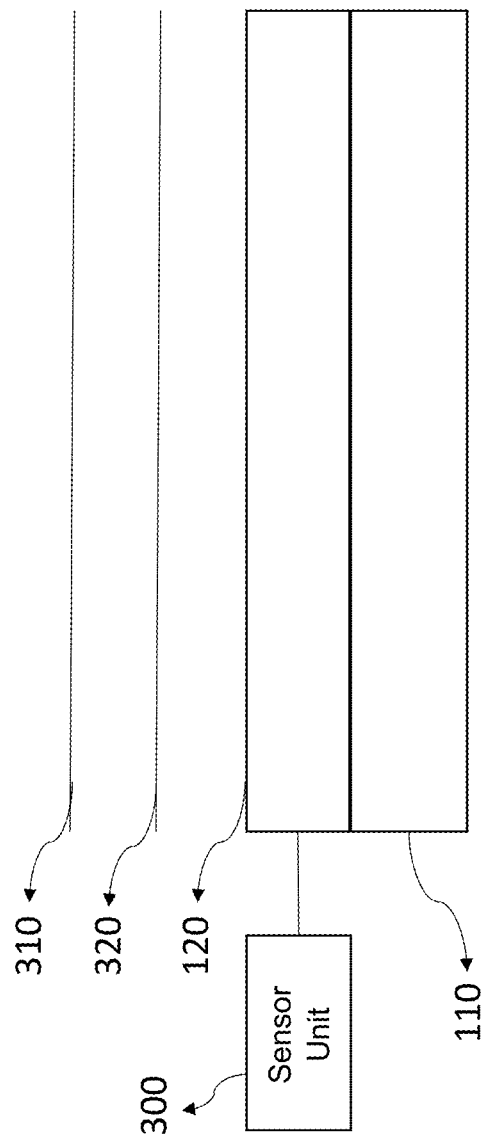
FIG. 5 is a cross sectional view of a transmission and distribution line monitoring device according to one embodiment of the present disclosure.

According to still another aspect of the present disclosure, there is provided a transmission and distribution line monitoring device including (See FIG. 5): a sensor unit 300 disposed outside a transmission 310 and distribution line 320; and a magnetoelectric energy harvester unit. Herein, the magnetoelectric energy harvester unit includes: a magnetostrictive material layer 110 including a magnetostrictive material which generates mechanical deformation when it is magnetized due to a change in a magnetic field generated from the transmission and distribution line; and a piezoelectric material layer 120 which has a bending vibration mode and includes a piezoelectric material which produces power by receiving a mechanical deformation force from the magnetostrictive material layer, and which supplies power to the sensor unit 300.

The transmission and distribution line monitoring device according to the present embodiment is a device which includes a magnetoelectric energy harvester and is operated by power supplied to a sensor unit disposed outside a transmission and distribution line. The magnetoelectric energy harvester produces power using a magnetic field generated by a current flowing in the transmission and distribution line, and supplies the generated power to the sensor unit for monitoring the transmission and distribution line to detect ambient temperature or pressure around the transmission and distribution line. Accordingly, battery replacement or repair can be reduced by using the magnetoelectric energy harvester which less breaks down than a motor-driven power generator and is able to continuously supply power as long as a current flows in the transmission and distribution line, and a cost can be saved and invested manpower resources can be efficiently used.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A magnetoelectric energy harvester comprising:
   a magnetostrictive material portion comprising a magnetostrictive material which generates a mechanical deformation when being magnetized; and
   a piezoelectric material portion comprising a piezoelectric material, wherein the piezoelectric material portion is configured to receive a mechanical deformation force from the magnetostrictive material portion, to generate bending vibrations in response to the mechanical deformation force, and to produce electrical power according to the bending vibrations,
   wherein the piezoelectric material portion comprises:
      a first piezoelectric material layer configured to receive the mechanical deformation force and to perform a first vibration in a stretching direction in response to the mechanical deformation force, and
      a second piezoelectric material layer in direct physical contact with the first piezoelectric material layer and spaced apart from the magnetostrictive material portion by the first piezoelectric material layer, wherein the second piezoelectric material layer is configured to perform a second vibration in a contracting direction different from the stretching direction in response to the mechanical deformation force such that the piezoelectric material portion performs the second vibration and produces the electrical power in response to the bending vibrations.

2. The magnetoelectric energy harvester of claim 1, wherein the magnetostrictive material is one of ferromagnetic metal, a ferritic ceramic, a magnetostriction alloy, and a magnetic shape memory alloy.

3. The magnetoelectric energy harvester of claim 1, wherein the piezoelectric material is one of $PbZrO_3$, $PbTiO_3$, $KNhO_3$, $NaNbO_3$, $BiTiO_3$, $NaTiO_3$, and $BaTiO_3$.

4. A method for manufacturing a magneto electric energy harvester, the method comprising:
   forming a magnetostrictive material layer by coating with a magnetostrictive material generating a mechanical deformation when being magnetized;
   forming a first piezoelectric material layer over the magnetostrictive material layer;
   performing, at the first piezoelectric material layer, a first vibration in a stretching direction in response to a mechanical deformation force received from the magnetostrictive material layer;
   forming a second piezoelectric material layer in direct physical contact with the first piezoelectric material layer and spaced apart from the magnetostrictive material layer by the first piezoelectric material layer; and
   performing, at the second piezoelectric material layer, a second vibration in a contracting direction different from the stretching direction in response to the mechanical deformation force such that the first and second piezoelectric material layers generate, in response to the mechanical deformation force, bending vibrations and produce electrical power.

5. A transmission and distribution line monitoring device comprising:
   a sensor unit disposed outside a transmission and distribution line; and
   a magnetoelectric energy harvester unit which comprises:
      a magnetostrictive material portion comprising a magnetostrictive material configured to generate a mechanical deformation when being magnetized; and
      a piezoelectric material portion comprising a piezoelectric material, wherein the piezoelectric material portion is configured to receive a mechanical deformation force from the magnetostrictive material portion, to generate bending vibrations in response to the mechanical deformation force, and to produce electrical power according to the bending vibrations, wherein the piezoelectric material portion comprises:
      a first piezoelectric material layer configured to receive the mechanical deformation force and to perform a first vibration in a stretching direction in response to the mechanical deformation force, and
      a second piezoelectric material layer in direct physical contact with the first piezoelectric material layer and spaced apart from the magnetostrictive material portion by the first piezoelectric material layer, wherein the second piezoelectric material layer is configured to perform a second vibration in a contracting direction different from the stretching direction in response to the mechanical deformation force such that the piezoelectric material portion performs the second vibration and produces the electrical power in response to the bending vibrations.

6. The transmission and distribution line monitoring device of claim 5, wherein the sensor unit comprises at least one of a temperature sensor and a pressure sensor.

* * * * *